(12) United States Patent
Zou et al.

(10) Patent No.: US 10,651,867 B2
(45) Date of Patent: May 12, 2020

(54) HIGH-SPEED AND HIGH-PRECISION PHOTONIC ANALOG-TO-DIGITAL CONVERSION DEVICE AND METHOD FOR REALIZING INTELLIGENT SIGNAL PROCESSING USING THE SAME

(71) Applicant: Shanghai Jiao Tong University, Shanghai (CN)

(72) Inventors: Weiwen Zou, Shanghai (CN); Shaofu Xu, Shanghai (CN); Jianping Chen, Shanghai (CN)

(73) Assignee: Shanghai Jiao Tong University, Shanghai (CN)

( * ) Notice: Subject to any disclaimer, the term of this patent is extended or adjusted under 35 U.S.C. 154(b) by 0 days.

(21) Appl. No.: 16/132,103

(22) Filed: Sep. 14, 2018

(65) Prior Publication Data

US 2019/0319634 A1 Oct. 17, 2019

(30) Foreign Application Priority Data

Apr. 14, 2018 (CN) .......................... 2018 1 0334076

(51) Int. Cl.
*G02F 7/00* (2006.01)
*H03M 1/14* (2006.01)
(Continued)

(52) U.S. Cl.
CPC .............. *H03M 1/146* (2013.01); *G02F 7/00* (2013.01); *H03M 1/168* (2013.01); *H03M 1/361* (2013.01); *H03M 1/46* (2013.01)

(58) Field of Classification Search
CPC . G02F 7/00; H03M 1/46; H03M 1/74; H03M 3/424; H03M 3/43; H03M 3/468; H04J 14/02
See application file for complete search history.

(56) References Cited

U.S. PATENT DOCUMENTS 6,100,831 A * 8/2000 Frankel ..................... G02F 7/00
341/137
7,826,752 B1 * 11/2010 Zanoni ............... H04B 10/5055
398/186
(Continued)

OTHER PUBLICATIONS

"Juodawlkis et al Optically Sampled Analog-to-Digital Converters", Oct. 2001, IEEE Transistions on Microwave Theory and Techniques, vol. 40, No. 10, pp. 1841-1853.*
(Continued)

*Primary Examiner* — Tanya T Motsinger
(74) *Attorney, Agent, or Firm* — Mei & Mark LLP; Manni Li

(57) ABSTRACT

A high-speed and high-precision photonic analog-to-digital conversion device capable of realizing intelligent signal processing. Learning ability of deep learning technology is utilized to learn the nonlinear response and channel mismatch effect of the system and configure optimal parameters of the deep network. Deterioration of photonic analog-to-digital conversion system performance caused by nonlinear distortion and channel mismatch distortion is eliminated in real time, and performance indicators thereof are improved. By using the induction and deduction ability of deep learning technology, intelligent signal processing of the input signal is realized, and users are provided with digital signals that meet the requirements. It's important for improving the performance of microwave photonic systems that require high sampling rate, high time precision, and high sampling accuracy, such as microwave photonic radar and optical communication systems, and also critical to improve the signal processing ability of such systems under complex conditions.

15 Claims, 5 Drawing Sheets

(51) Int. Cl.
*H03M 1/16* (2006.01)
*H03M 1/36* (2006.01)
*H03M 1/46* (2006.01)

(56) References Cited

U.S. PATENT DOCUMENTS

| | | | | |
|---|---|---|---|---|
| 9,438,263 | B1* | 9/2016 | Ng | H03M 1/1245 |
| 9,843,398 | B1* | 12/2017 | Zanoni | H04B 1/0007 |
| 2002/0067299 | A1* | 6/2002 | Clark | G02F 7/00 |
| | | | | 341/137 |
| 2002/0163454 | A1* | 11/2002 | Yap | H03M 3/468 |
| | | | | 341/137 |
| 2003/0025900 | A1* | 2/2003 | Araki | G01M 11/3127 |
| | | | | 356/73.1 |
| 2003/0091116 | A1* | 5/2003 | Yap | H03M 3/47 |
| | | | | 375/247 |
| 2003/0128143 | A1* | 7/2003 | Yap | H03M 3/496 |
| | | | | 341/143 |
| 2011/0234435 | A1* | 9/2011 | Woodward | H03M 1/124 |
| | | | | 341/137 |
| 2012/0213531 | A1* | 8/2012 | Nazarathy | H03M 1/145 |
| | | | | 398/202 |
| 2013/0114073 | A1* | 5/2013 | Namba | G01J 1/10 |
| | | | | 356/226 |
| 2018/0006730 | A1* | 1/2018 | Kuo | H04B 10/615 |
| 2018/0081202 | A1* | 3/2018 | Konishi | G02F 7/00 |
| 2019/0319634 | A1* | 10/2019 | Zou | H03M 1/361 |

OTHER PUBLICATIONS

"Neural network (NN)." Hargrave's Communications Dictionary, Wiley, Frank Hargrave, Wiley, 1st edition, 2001. Credo Reference, https://search.credoreference.com/content/entry/hargravecomms/neural_network_nn/0?institutionId=743. Accessed Aug. 20, 2019.*

U.S. Appl. No. 16/132,202, Shanghai Jiao Tong University, filed Sep. 14, 2018.

George C. Valley, "Photonic analog-to-digital converters," Optics Express, vol. 15, No. 5, pp. 1955-1982 (Mar. 5, 2007).

G. Yang et al., "Compensation of multi-channel mismatches in high-speed high-resolution photonic analog-to-digital converter," Optics Express, vol. 24, No. 21, pp. 24061-24074 (Oct. 17, 2016).

Yann LeCun et al., "Deep learning," Nature, vol. 521, pp. 436-444 (May 28, 2015).

David Silver et al., "Mastering the game of Go with deep neural networks and tree search," Nature, vol. 529, pp. 484-503 (Jan. 28, 2016).

Junyuan Xie et al., "Image denoising and inpainting with deep neural networks," International Conference on Neural Information Processing Systems, pp. 341-349 (2012).

* cited by examiner

HIGH-SPEED AND HIGH-PRECISION PHOTONIC ANALOG-TO-DIGITAL CONVERSION DEVICE AND METHOD FOR REALIZING INTELLIGENT SIGNAL PROCESSING USING THE SAME

CROSS-REFERENCE TO RELATED APPLICATION

The subject application claims priority on Chinese application no. 201810334076.6 filed on Apr. 14, 2018. The contents and subject matter of the Chinese priority application is incorporated herein by reference.

FIELD OF TECHNOLOGY

The present invention relates to optical information processing, particularly, a high-speed and high-precision photonic analog-to-digital conversion device and method for realizing intelligent signal processing using the same.

BACKGROUND ART

An analog-to-digital converter (ADC) is a tool that converts analog input signals into digital signals that are represented by computers. The ADC is a bridge between the analog world and computer signal processing, and is the foundation of signal storage, transmission, and processing. Research on the ADC in the field of electronics has developed rapidly. In recent decades, electronic analog-to-digital converters (EADC) have made great progress on high sampling rate and high precision. The international commercial EADC chip can achieve the performance that the sampling rate is 30 GS/s and the effective bit is 5.5. However, due to inherent defects of the electronics technology, such as narrow processing bandwidth, large time jitter, and large transmission loss, it is of great difficulty to further break the limits of the sampling rate and sampling accuracy. New methods must be studied to realize large bandwidth analog-to-digital conversion with ultra-high sampling rate and high precision. Photonic analog-to-digital converter (PADC), as a further development of the ADC technology, can take the advantage of photonics such as ultra-high bandwidth, ultra-low time jitter, and low transmission loss, break through the limitations brought by EADC technology, and achieve analog-to-digital conversion with higher sampling rate and higher sampling accuracy. See George Valley, "Photonic analog-to-digital converter," Optics Express, Vol. 15, No. 5, pp. 1955-1982, 2007. At the present, among various PADC schemes that have been proposed, the most concerned is the optical sampling and electrical quantization architecture. The architecture not only takes advantage of the large bandwidth and the low jitter of photonics, but also combines the mature quantitative ability of electronics. The architecture effectively breaks the electronic bottleneck. At present, the sampling rate of the PADC system in the international report has already surpasses 40 GS/s, and the effective number of bits of the reported system can reach 7~8 bit. See G. Yang et al., "Compensation of multi-channel mismatches in high-speed high-resolution photonic analog-to-digital converter," Opt. Express, Vol. 24, pp. 24074. However, in the architecture of the PADC, the photon sampling gate is an essential key device to the conversion process from electricity to light. The nonlinear response of the device limits the improvement on the performance of the PADC. In addition, the implementation of the multi-channel in the architecture of the PADC may also cause channel mismatch and limit the performance of the PADC.

In recent years, deep learning has received widespread attention as a technology that can effectively implement artificial intelligence. To further develop the potential of the artificial intelligence, researchers use deep learning techniques to build intelligent algorithm architectures and to implement intelligent machines that respond in ways similar to human intelligence. Most deep learning algorithms use neural network architectures. A large number of hidden layers of neural networks increase the complexity of the entire architecture, and also provide the possibility for intelligent algorithms to implement more complex functions. At present, deep learning technology has been widely used in related fields such as autonomous driving, industrial automation, human-computer interaction, image recognition, and intelligent voice. Besides, many researchers are constantly exploring in the forefront of the deep learning technology. In terms of signal reconstruction, especially noise removal, deep learning technology is widely used in the fields of image denoising, image text removal, and image demosaicing because of their adaptability to noise, accuracy of de-noising results, and the advantage of large sample applicability. See Junyuan Xie et al., "Image denoising and inpainting with deep neural network," International Conference on Neural Information Processing Systems, pp. 341-349, 2012. Applying deep learning to the PADC system will effectively improve the performance of the PADC system, especially eliminate the limitations introduced by nonlinearity and channel mismatch, and thereby achieve analog-to-digital conversion systems with high-speed and high-precision that meet higher demands. In addition, the intelligence of deep learning provides us with an intelligent signal processing ability that may be realized in the PADC. With the ability, functions such as intelligent recognition and intelligent processing of various signals may be realized.

SUMMARY OF THE INVENTION

The present invention aims at the bottleneck of performance improvement of the photonic analog-to-digital conversion system and, with the combination of an effective new technology, proposes a high-speed and high-precision photonic analog-to-digital conversion device capable of realizing intelligent signal processing. The device of the present invention adds deep learning technology to the multi-channel PADC architecture, and uses the learning ability of the deep learning technology to learn the nonlinear response and channel mismatch effect of the PADC system. By the means, the inverse response of the PADC is obtained, which effectively improves the nonlinear response and channel mismatch effect of the PADC system as well as conversion accuracy of the PADC system. On the other hand, by using the induction and deduction ability of the deep learning technology, intelligent signal processing of input signals may be realized, and provide users with digital signals that meet the requirements. These two functions ultimately appear as a high-speed and high-precision photonic analog-to-digital conversion device for realizing intelligent signal processing.

The technical solution of present invention is as follows:

A high-speed and high-precision photonic analog-to-digital conversion device for realizing intelligent signal processing, which comprises a high-speed photonic analog-to-digital conversion system and a deep learning signal processing module. The high-speed photonic analog-digital conversion system in turn includes a high-repetition-rate pulse light source, a photon sampling gate, a multi-channel demultiplexer module, a parallelization photoelectric conversion module, and a parallelization electronic-quantization module. The deep learning signal processing module includes a signal source, a digital signal processor, and a deep network. The multi-channel demultiplexer module has N output ports. The nth output port is connected to the nth input port of the parallelization photoelectric conversion module. The nth output port of the parallelization photoelectric conversion module is connected to the nth input port of the parallelization electronic-quantization module. The nth output port of the parallelization electronic-quantization module is connected to the nth input port of the deep network. The range of values for n is from 1 to N. During the training phase, the signal source is connected to the second input port of the photon sampling gate. The output port of the digital signal processor is connected to the (N+1)th input port of the deep network. During the application phase, the sampled signals are inputted by the second input port of the photon sampling gate.

The high-repetition-rate pulse light source is the high-repetition-rate optical pulse generated by an actively mode-locked laser, a modulation frequency comb, wavelength divided multiplexed (WDM) source, or time divided multiplexed (TDM) source.

The photon sampling gate is a lithium niobate electro-optic modulator, a polymer electro-optic modulator, an integrated electro-optic modulator, or a spatial light modulator.

The multi-channel demultiplexer module is a wavelength divided multiplex (WDM), time divided multiplex (TDM), or an optical switch parallel demultiplexer.

The parallelization photoelectric conversion module is a PIN photodiode or an avalanche photodiode.

The parallelization electronic-quantization module is an oscilloscope or an information processing board.

The signal source is a phase locked multiple frequency source, an electro-optical oscillator, or an arbitrary waveform generator.

The digital signal processor is a field programmable gate array (FPGA) or a digital signal processing (DSP).

The deep network is a convolution neural network or a recurrent neural network. The method for implementing the deep network is a central processing unit (CPU), a graphic processing unit (GPU), a tensor processing unit (TPU), or a photonic neural network.

The present invention further provides an analog-to-digital conversion method using the above-described high-speed and high-precision photonic analog-to-digital conversion device based on deep learning includes the following two functions:

The first function is for high-speed and high-precision photonic analog-to-digital conversion. The conversion process has the following phases:

Training phase: standard sinusoidal signals with known frequency and amplitude information provided by the signal source are inputted into the high-speed photonic analog-to-digital conversion system, sampled by the high-repetition-rate pulse light source, and sequentially passed through the multi-channel demultiplexer module and the parallelization photoelectric conversion module. Digital signals affected by the distortion of the high-speed photonic analog-to-digital conversion system are obtained at the output port of the parallelization electronic-quantization module, and are inputted into the deep network as part of the training sample set. The digital signal processor generates standard sinusoidal digital signals according to the known frequency and amplitude information, and inputs them to the deep network as another part of the training sample set. The deep network combines the distorted digital signals and the standard sinusoidal digital signals to train the parameters of the deep network, reset the parameters of the deep network, and establish the inverse response of the distortion effect of the high-speed photonic analog-to-digital conversion system.

Application phase: The signals to be sampled are inputted into the high-speed photonic analog-to-digital conversion system by the second input port of the photon sampling gate, sampled by the high-repetition-rate pulse light source, sequentially pass through the multi-channel demultiplexer module and the parallelization photoelectric conversion module, and then are inputted into the deep network by the parallelization electronic-quantization module. The deep network uses the inverse response of the distortion effect of the high-speed photonic analog-to-digital conversion system to perform intelligent signal processing on the digital signals and obtains digital signals after distortion elimination.

The second function is for customized intelligent signal processing. The processing process has the following phases:

Training phase: customized waveform signals provided by the signal source are inputted into the high-speed photonic analog-to-digital conversion system, sampled by the high-repetition-rate pulse light source, and sequentially passed through the multi-channel demultiplexer module and the parallelization photoelectric conversion module. All sampling results of the waveform signals are obtained at the output port of the parallelization electronic-quantization module, and are treated as part of the training sample set. The digital signal processor generates customized digital signals as another part of the training sample set. The deep network combines sampling results of the high-speed photonic analog-to-digital conversion system and customized digital signals to train the parameters of the deep network, reset the parameters of the deep network, and establish a customized calculation model for intelligent signal processing in the deep network.

Application phase: the sampled signals are inputted into the high-speed photonic analog-to-digital conversion system by the second input port of the photon sampling gate, sampled by the high-repetition-rate pulse light source, sequentially pass through the multi-channel demultiplexer module and the parallelization photoelectric conversion module, and then are inputted into the deep network by the parallelization electronic-quantization module. The deep network uses the customized calculation model for intelligent signal processing to perform intelligent signal processing on the digital signals and outputs digital signals that meet customization requirements.

Based on the above technical features, the present invention is advantageous in that:

1. The present invention employs the deep network with the network parameters optimization configuration completed to handle the raw data. Because of the high execution speed, less consuming-time and small memory usage of the algorithm, real-time data processing may be realized.

2. By using the learning ability of the deep learning technology, the nonlinearity and channel mismatch effect in the photonic analog-to-digital conversion system are subjected to reconstruction and calculation without increasing the complexity of the photonic analog-to-digital conversion system, and the output reconstructed has high recovery degree of signal. As a consequence, the high-speed photonic analog-to-digital conversion system has high accuracy.

3. By using the induction and deduction ability of deep learning technology, the present invention performs customized intelligent signal processing on the sampled signals of the photonic analog-to-digital conversion system according to specific needs and obtains user-definable signal processing results.

The present invention is useful for improving the performance of microwave photon systems requiring high sampling rate, high time precision, and high sampling precision, such as microwave photon radar and optical communication system. Besides, the present invention plays an important role in improving the signal processing ability of such systems under complicated conditions.

DETAILED DESCRIPTIONS OF THE INVENTION AND EMBODIMENTS

In combination with figures and embodiments, the present invention is further expounded. The embodiments are implementation based on the technical solution of the present invention and are not meant to limit the scope of the present invention.

Figure 1:
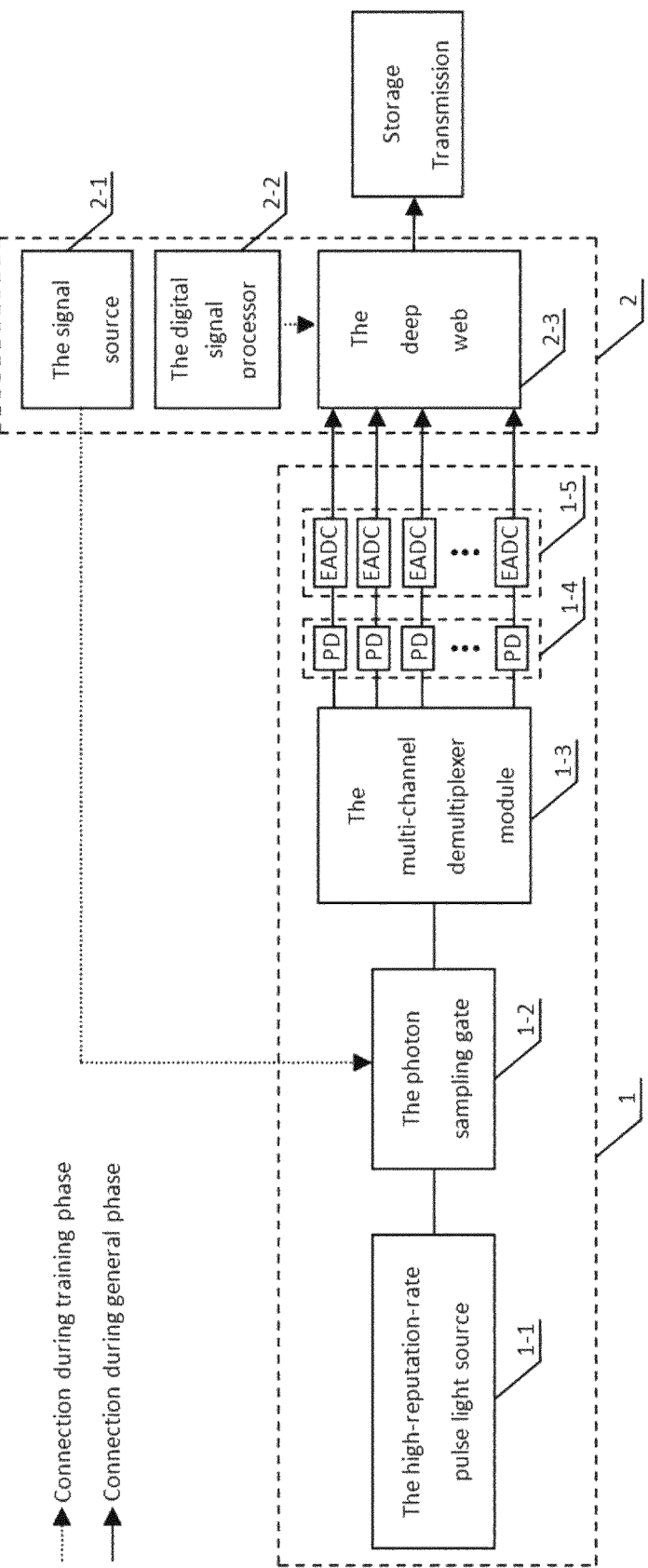
FIG. 1 is a structure diagram showing the high-speed and high-precision photonic analog-to-digital conversion device of the present invention.

As shown in FIG. 1, a high-speed and high-precision photonic analog-to-digital conversion device for realizing intelligent signal processing of the present invention comprises a high-speed photonic analog-to-digital conversion system 1 and a deep learning signal processing module 2. The high-speed photonic analog-digital conversion system 1 includes a high-repetition-rate pulse light source 1-1, a photon sampling gate 1-2, a multi-channel demultiplexer module 1-3, a parallelization photoelectric conversion module 1-4, and a parallelization electronic-quantization module 1-5. The high-repetition-rate pulse light source 1-1 employing an actively mode-locked laser is used to generate high rate photonic sample sequences. The photon sampling gate 1-2 employing Mach-Zehnder modulator is used to realize photon sampling of analog electrical signals. The multi-channel demultiplexer module 1-3 employing optical switch parallel demultiplexer is used to implement a multi-channel demultiplexing function of a high-speed optical sampling sequence, and demultiplexes high-speed optical pulses into respective channels. The parallelization photoelectric conversion module 1-4 employing N PIN photodetectors is used to convert multi-channel demultiplexed optical signals into electrical signals. The parallelization electronic-quantization module 1-5 employing a multi-channel oscilloscope is used to convert analog electrical signals into digital sampling results.

Figure 2:
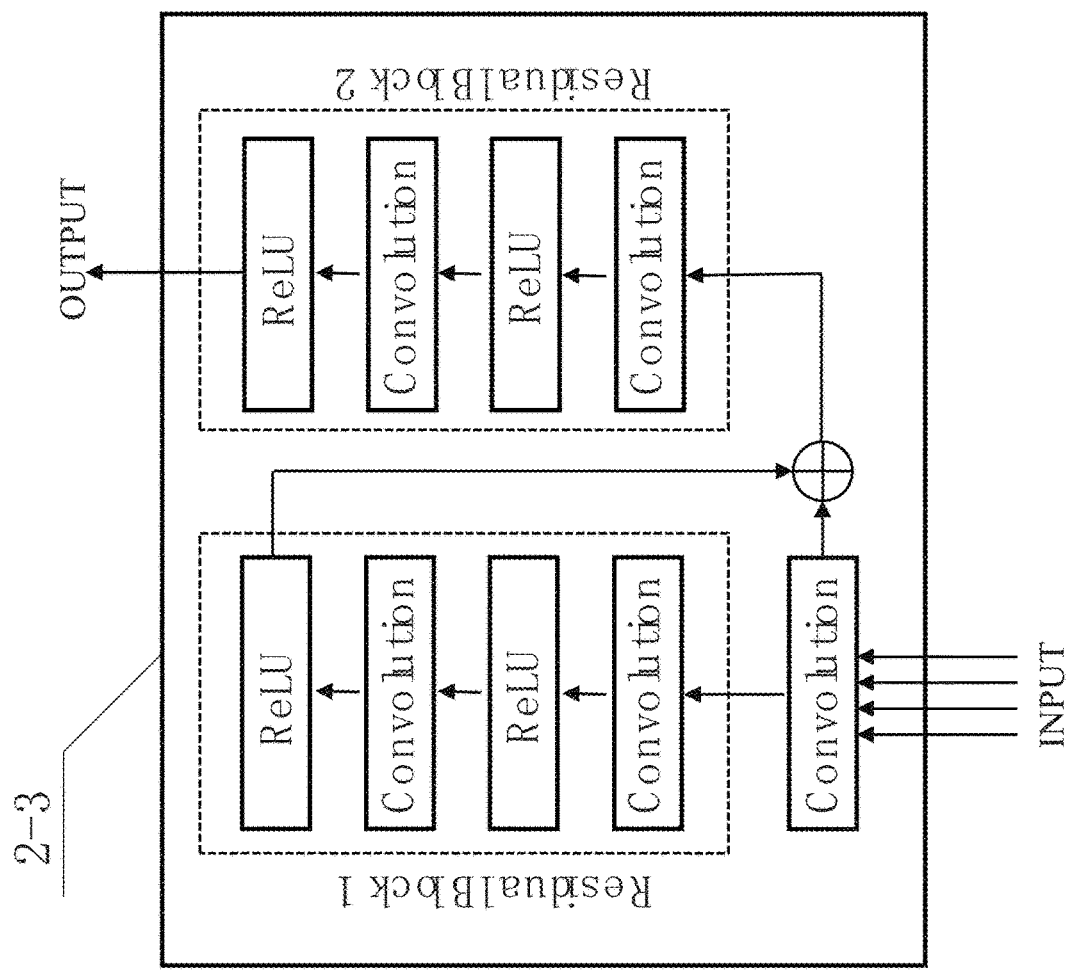
FIG. 2 is a diagram showing an embodiment of the convolution neural network based on residual learning of the present invention.

The deep learning signal processing module 2 includes a signal source 2-1, a digital signal processor 2-2, and a deep network 2-3. The signal source 2-1 employing a microwave source and an arbitrary waveform generator is used to generate customized signals according to specific needs and provide these signals to the deep network as part of the training sample set through the high-speed photonic analog-digital conversion system 1. The digital signal processor 2-2 employing DSP technology is used to generate customized digital signals according to specific needs and provide these signals to the deep network as part of the training sample set. The deep network 2-3 employing a residual learning neural network with two residual blocks (see FIG. 2) is built in a computer with dual GPUs. The deep network proceeds training according to training samples to implement customized functions in the network and output digital signals that satisfy custom functional requirements.

The device of the present invention is implemented in a process that includes two phases: a training phase and an application phase. Depending on different functions, the connections and functions of modules in the two phases are described as follows. First of all, the following are always connected in general. The first output port of the high-repetition-rate pulse light source 1-1 is connected to the first input port of the photon sampling gate 1-2. The signals to be sampled are inputted through the second input port of the photon sampling gate. The first output port of the photon sampling gate 1-2 is connected to the first input port of the multi-channel demultiplexer module 1-3. The multi-channel demultiplexer module 1-3 has N outputs. The nth ($1 \leq n \leq N$) output port is connected to the nth input port of the parallelization photoelectric conversion module 1-4. The nth output port of the parallelization photoelectric conversion module 1-4 is connected to the nth input port of the parallelization electronic-quantization module 1-5. The nth output port of the parallelization electronic-quantization module 1-5 is connected to the nth input port of the deep network 2-3.

1. High-speed and High-precision Photonic Analog-to-digital Conversion Function:

Training phase: the first output port of the signal source 2-1 is connected to the second input port of the photon sampling gate 1-2. The first output port of the digital signal processor 2-2 is connected to the N+1th input port of the deep network 2-3. The first output port of the deep network 2-3 outputs digital signals for storage, transmission or processing.

Under the function, the signal source 2-1 provides standard sinusoidal signals with known frequency and amplitude information. Specifically, the Nyquist frequency is equally divided into 24 parts, and the amplitude is equally divided into 7 parts, which makes a total of 168 sets of sinusoidal signals. These signals are inputted into the high-speed photonic analog-to-digital conversion system 1, sampled by the high-repetition-rate pulse light source 1-1, and then sequentially pass through the multi-channel demultiplexer module 1-3 and the parallelization photoelectric conversion module 1-4. Digital signals affected by the distortion of the high-speed photonic analog-to-digital conversion system 1 are obtained at the output port of the parallelization electronic-quantization module 1-5, and are treated as part of the training sample set. The digital signal processor 2-2 generates 168 sets of standard sinusoidal digital signals according to the known frequency and amplitude information, which are treated as another part of the training sample set. The deep network 2-3 combines the distorted digital signals and the standard sinusoidal digital signals to train a total of 16673 parameters of the deep network and reset the parameters of the deep network (deep network is detailed in FIG. 2). After several iterations, the inverse response of the distortion effect of the high-speed photonic analog-to-digital conversion system is established in the deep network.

Application phase: the sampled signals are inputted into the high-speed photonic analog-to-digital conversion system 1 by the second input port of the photon sampling gate 1-2, sampled by the high-repetition-rate pulse light source 1-1, and then sequentially pass through the multi-channel demultiplexer module 1-3 and the parallelization photoelectric conversion module 1-4. The digital signals are inputted into the deep network 2-3 by the parallelization electronic-quantization module 1-5. The deep network 2-3 performs intelligent signal processing on the digital signals by using the inverse response of the distortion effect of the high-speed photonic analog-to-digital conversion system to obtain digital signals after distortion elimination.

2. Customized Intelligent Signal Processing Function:

In the embodiment, an intelligent signal extraction function for distinguishing square waves from triangular waves is implemented.

Training phase: the first output port of the signal source 2-1 is connected to the second input port of the photon sampling gate 1-2. The first output port of the digital signal processor 2-2 is connected to the (N+1)th input port of the deep network 2-3. The first output port of the deep network 2-3 outputs digital signals for storage, transmission or processing.

Under the function, the signal source 2-1 provides mixed signals according to 500 sets of triangular waves from random positions and square waves from random positions.

These signals are inputted into the high-speed photonic analog-to-digital conversion system 1 for analog-to-digital conversion. Sampling results of all waveform signals are obtained at the output port of the parallelization electronic-quantization module 1-5 are treated as part of the training sample set. The digital signal processor 2-2 generates digital signals containing only triangular waves at the same position as the above signals, which are treated as another part of the training sample set.

The deep network 2-3 combines sampling results of the high-speed photonic analog-to-digital conversion device with the digital signals containing only triangular waves to train a total of 16673 parameters of the deep network and reset the parameters of the deep network. After several iterations, a signal calculation model for extracting triangular waves from the mixed signals containing square waves and triangular waves is established in the deep network.

Application phase: the sampled signals are inputted by the second input port of the photon sampling gate 1-2, and the digital signals are inputted into the deep network 2-3 by the parallelization electronic-quantization module 1-5. After the signal calculation model for extracting the triangular waves from the mixed signals containing square waves and triangular waves is established in the deep network is processed, these digital signals are outputted by the output port of the deep network 2-3 for storage, transmission or processing.

Under the function, the deep network 2-3 has established a signal processing calculation model for extracting the triangular waves from the mixed signals containing square waves and triangular waves, which can perform intelligent signal processing on the digital signals outputted by the high-speed photonic analog-to-digital conversion system 1.

Figure 3A:
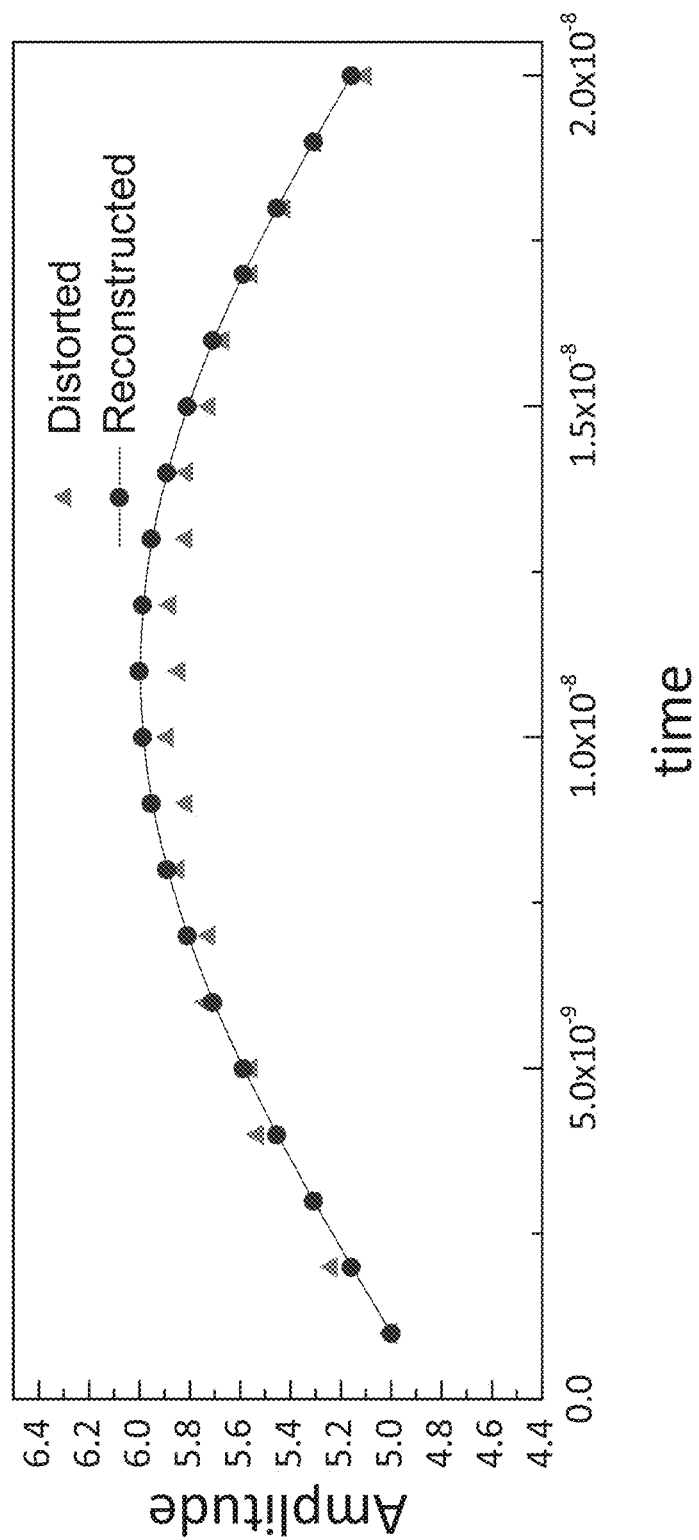
FIG. 3A shows the recovery and reconstruction of distortion signals in the deep network in the present invention, where reconstruction of the time domain signals is shown.
Figure 3B:
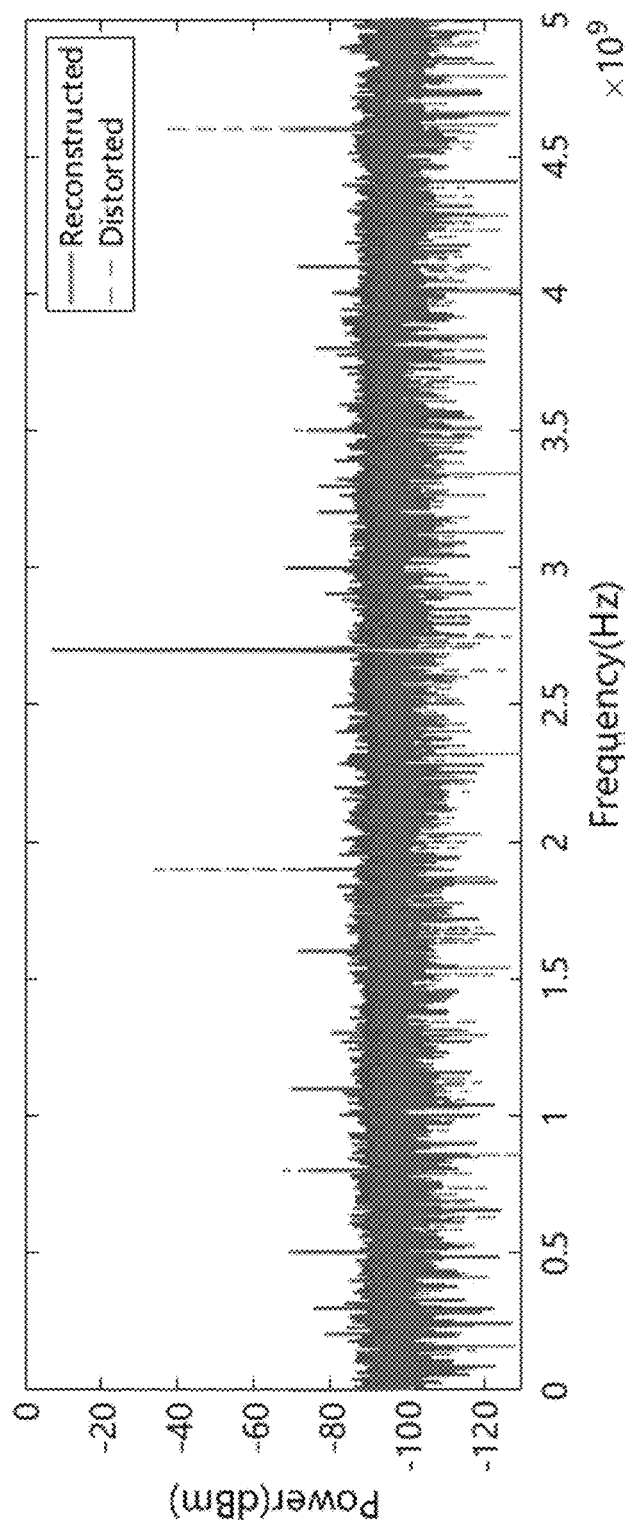
FIG. 3B shows the recovery and reconstruction of distortion signals in the deep network in the present invention, where reconstruction of a frequency domain diagram is shown.
Figure 4:
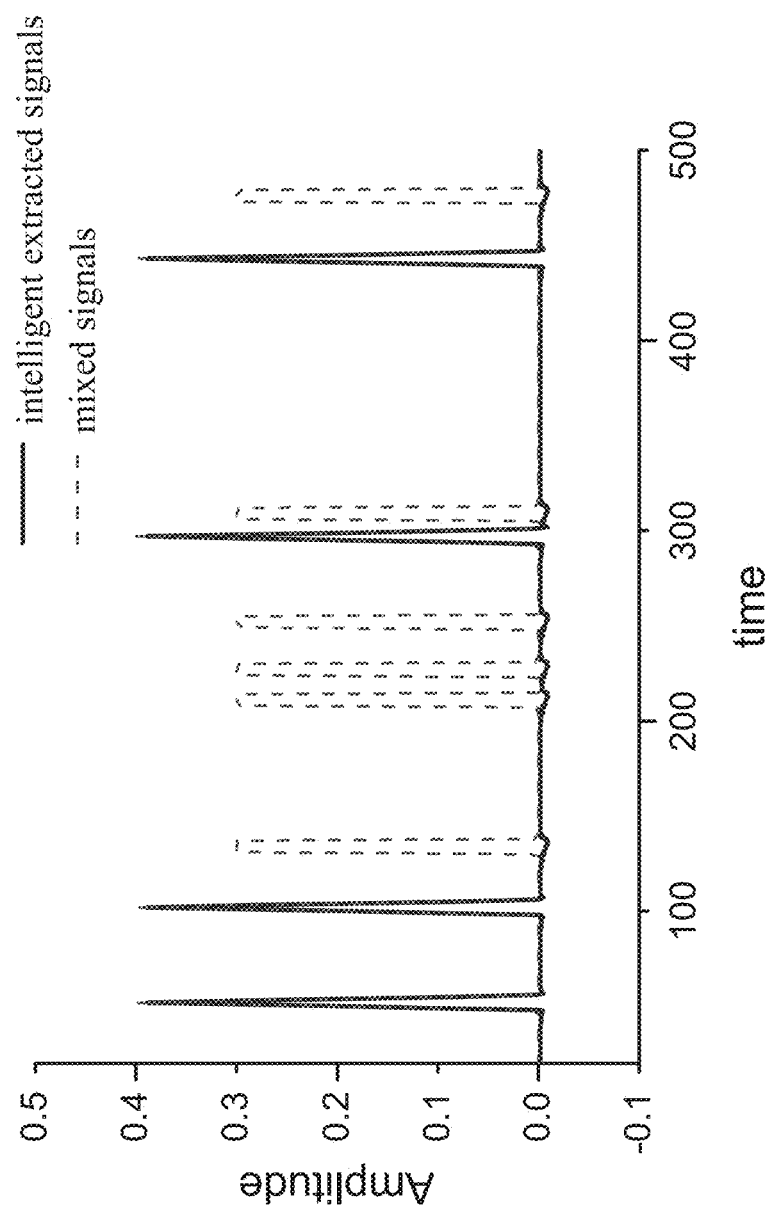
FIG. 4 is a schematic showing realization of the intelligent signal processing ability in the present invention.

The above process utilizing the learning ability of deep learning technology trains the nonlinearity and channel mismatch characteristics in the photonic analog-to-digital conversion system by using a large amount of actual experimental data, and configures the optimal parameters of the deep network. The learning of nonlinearity and channel mismatch response to the high-speed photonic analog-to-digital conversion system is completed and its inverse response is established. The suppression of the distortion effect of the photonic analog-to-digital conversion output is completed, and the result diagram is shown in FIGS. 3A and 3B. FIGS. 3A and 3B show recovery and reconstruction of distortion signals in the deep network, where FIG. 3A shows the reconstruction effect of the time domain signals, and FIG. 3B shows the reconstruction effect of the frequency domain diagram. FIGS. 3A and 3B show the time domain and frequency domain effects of the original sampled signals, which are obtained after the reconstruction of the sampled results suffered from channel mismatch and nonlinearity distortion by the deep network. In addition, using the induction and deduction ability of deep learning technology, through the training of experimental data, the calculation model of intelligent signal processing is established in the deep network, and intelligent processing of the sampling signals of the photonic analog-to-digital conversion system is completed as shown in FIG. 4. FIG. 4 describes the ability of the device to implement a selective signal processing that achieves the ability to extract triangular wave signals from the mixed signals containing square wave signals and triangular wave signals in the embodiment. The above functions are important for improving the performance of microwave photonic systems that require high sampling rate, high time precision, and high sampling accuracy, such as microwave photonic radar and optical communication systems, and are also critical to improve the signal processing ability of such systems under complex conditions.

We claim:

1. A high-speed and high-precision photonic analog-to-digital conversion device for realizing intelligent signal processing, comprising a high-speed photonic analog-to-digital conversion system, the high-speed photonic analog-digital conversion system comprising a high-repetition-rate pulse light source having a first output port, a photon sampling gate having a first input port and a second input port and a first output port, a multi-channel demultiplexer module having a first input port and N output ports, a parallelization photoelectric conversion module having N input ports and N output ports, and a parallelization electronic-quantization module having N input ports and N output ports, and a deep learning signal processing module, the deep learning signal processing module comprising a signal source having a first output port, a digital signal processor having an output port, and a deep network having N+1 input ports, wherein the first output port of the high-repetition-rate pulse light source is connected to the first input port of the photon sampling gate;

the second input port of the photon sampling gate is switchably connected to the first output port of the signal source in a training phase or to a sampling signal source in an application phase, the first output port of the photon sampling gate is connected to the first input port of the multi-channel demultiplexer module, an nth output port of the multi-channel demultiplexer module is connected to an nth input port of the parallelization photoelectric conversion module;

an nth output port of the parallelization photoelectric conversion module is connected to the nth input port of the parallelization electronic-quantization module;

the nth output port of the parallelization electronic-quantization module is connected to the nth input port of the deep network;

n is an integer in a range of from 1 to N; and the deep network is a convolution neural network or a recurrent neural network that is implemented in a central processing unit (CPU), a graphic processing unit (GPU), a tensor processing unit (TPU), or a photonic neural network.

2. The device of claim 1, wherein the device is in the training phase, the second input port of the photon sampling gate is connected to the first output port of the signal source; and the output port of the digital signal processor is connected to the (N+1)th input port of the deep network.

3. The device of claim 1, wherein the device is in the application phase, and the second input port of the photon sampling gate is connected to the sampling signal source for inputting sampled signals.

4. The device of claim 1, wherein the high-repetition-rate pulse light source is an actively mode-locked laser, a modulation frequency comb, a wavelength divided multiplexed (WDM) source, or a time divided multiplexed (TDM) source for generating high-repetition-rate optical pulses.

5. The device of claim 1, wherein the photon sampling gate is a lithium niobate electro-optic modulator, a polymer electro-optic modulator, an integrated electro-optic modulator, or a spatial light modulator.

6. The device of claim 1, wherein the multi-channel demultiplexer module is a wavelength divided multiplexer (WDM), a time divided multiplexer (TDM), or an optical switch parallel demultiplexer.

7. The device of claim 1, wherein the parallelization photoelectric conversion module is a PIN photodiode or an avalanche photodiode.

8. The device of claim 1, wherein the parallelization electronic-quantization module is an oscilloscope or an information processing board.

9. The device of claim 1, wherein the signal source is a phase locked multiple frequency source, an electro-optical oscillator, or an arbitrary waveform generator.

10. The device of claim 1, wherein the digital signal processor is a field programmable gate array (FPGA) or a digital signal processor (DSP).

11. A method for high-speed and high-precision photonic analog-to-digital conversion using the device of claim 1, comprising in a training phase, inputting standard sinusoidal signals with known frequency and amplitude information provided by the signal source into the high-speed photonic analog-to-digital conversion system, sampling the standard sinusoidal signals by the high-repetition-rate pulse light source, and sequentially passed the standard sinusoidal signals through the multi-channel demultiplexer module and the parallelization photoelectric conversion module, obtaining digital signals affected with distortion by the high-speed photonic analog-to-digital conversion system at the output ports of the parallelization electronic-quantization module, inputting the distorted digital signals into the deep network as a first part of a training sample set, generating standard sinusoidal digital signals according to the known frequency and amplitude information by the digital signal processor, inputting the standard sinusoidal digital signals to the deep network as a second part of the training sample set, combining the distorted digital signals and the standard sinusoidal digital signals by the deep network to train parameters relating to distortion effect in the distorted digital signals relating to time domain and frequency domain information of the deep network, and resetting the parameters on the time domain and the frequency domain information of the deep network to establish an inverse response of the distortion effect of the high-speed photonic analog-to-digital conversion system; and in an application phase, inputting sampled signals into the high-speed photonic analog-to-digital conversion system by the second input port of the photon sampling gate, sampling the sampled signals by the high-repetition-rate pulse light source, sequentially passing the sampled signals through the multi-channel demultiplexer module and the parallelization photoelectric conversion module to obtain digital signals, inputting the digital signals into the deep network by the parallelization electronic-quantization module, and using the inverse response of the distortion effect of the high-speed photonic analog-to-digital conversion system by the deep network to perform intelligent signal processing on the digital signals and obtains digital signals after distortion elimination.

12. A method for customized intelligent signal processing using the device of claim 1, comprising in a training phase, inputting customized waveform signals provided by the signal source into the high-speed photonic analog-to-digital conversion system, sampling the customized waveform signals by the high-repetition-rate pulse light source, and sequentially passing the customized waveform signals through the multi-channel demultiplexer module and the parallelization photoelectric conversion module, obtaining sampling results of the customized waveform signals at an output port of the parallelization electronic-quantization module, and treating the sampling results as a first part of a training sample set, generating customized digital signals by the digital signal processor as a second part of the training sample set, combining the first part and the second part of the training sample set by the deep network to train parameters relating to time domain and frequency domain information in the customized waveform signals and customized digital signals of the deep network, resetting the parameters relating to the time domain and the frequency domain information in the customized waveform signals and customized digital signals of the deep network to establish a customized calculation model for intelligent signal processing in the deep network; and in an application phase, inputting sampled signals into the high-speed photonic analog-to-digital conversion system by the second input port of the photon sampling gate, sampling the sampled signals by the high-repetition-rate pulse light source, sequentially passing the sampled signals through the multi-channel demultiplexer module and the parallelization photoelectric conversion module to obtain digital signals, inputting the digital signals into the deep network via the parallelization electronic-quantization module, using the customized calculation model in the deep network and performing intelligent signal processing on the digital signals, and outputting digital signals that meet customization requirements.

13. The high-speed and high-precision photonic analog-to-digital conversion device for realizing intelligent signal processing of claim 1, wherein the deep network is a convolution neural network that employs a residual learning neural network with two residual blocks and is built in a computer with dual GPUs.

14. The method for high-speed and high-precision photonic analog-to-digital conversion of claim 11, wherein the parameters relating to the time domain and the frequency domain information of the deep network are distortion of the known frequency and amplitude information in the distorted digital signals from the standard sinusoidal digital signals.

15. The method for high-speed and high-precision photonic analog-to-digital conversion of claim 12, wherein the parameters relating to the time domain and the frequency domain information in the customized waveform signals and customized digital signals of the deep network are frequency and amplitude information in the customized waveform signals and customized digital signals.

* * * * *